United States Patent [19]
Elarde

[11] Patent Number: 4,532,152
[45] Date of Patent: Jul. 30, 1985

[54] FABRICATION OF A PRINTED CIRCUIT BOARD WITH METAL-FILLED CHANNELS

[76] Inventor: Vito D. Elarde, 6429 Lance Ct., San Diego, Calif. 92120

[21] Appl. No.: 512,461

[22] Filed: Jul. 11, 1983

Related U.S. Application Data

[63] Continuation-in-part of Ser. No. 354,964, Mar. 5, 1982, abandoned, which is a continuation-in-part of Ser. No. 306,240, Sep. 28, 1981, abandoned, which is a continuation-in-part of Ser. No. 107,045, Dec. 26, 1979, abandoned.

[51] Int. Cl.³ ............................................. B05D 5/12
[52] U.S. Cl. ...................................... 427/96; 29/848;
29/849; 427/97; 427/98; 427/99; 427/250;
427/322; 427/367; 427/404; 427/423
[58] Field of Search ............... 427/96, 97, 98, 443.1,
427/99, 250, 309, 404, 322, 423, 367, 271;
204/15; 29/846, 847, 848, 849; 428/601

[56] References Cited

U.S. PATENT DOCUMENTS

| | | | |
|---|---|---|---|
| 2,716,268 | 8/1955 | Steigerwalt | 29/848 |
| 2,772,501 | 12/1956 | Malcolm | 29/849 |
| 2,927,043 | 3/1960 | Stetson | 427/367 |
| 3,081,525 | 3/1963 | Delbove | 29/155.5 |
| 3,448,516 | 6/1969 | Buck | 29/847 |
| 3,562,038 | 2/1971 | Shipley et al. | 427/98 |
| 3,620,933 | 11/1971 | Grunwald et al. | 427/98 |
| 3,628,243 | 12/1971 | Phol et al. | 29/849 |
| 3,698,940 | 10/1972 | Mersereau et al. | 427/98 |
| 3,791,848 | 2/1974 | DeAngelo | 427/98 |
| 4,024,631 | 5/1977 | Castillero | 29/847 |
| 4,125,637 | 11/1978 | Tanner | 427/369 |
| 4,157,407 | 6/1979 | Peiffer | 29/848 |
| 4,181,755 | 1/1980 | Liu et al. | 427/99 |
| 4,217,182 | 8/1980 | Cross | 427/98 |
| 4,263,341 | 4/1981 | Martyniak | 427/97 |
| 4,303,798 | 12/1981 | Paunovic | 427/98 |
| 4,374,457 | 2/1983 | Wiech | 29/848 |

Primary Examiner—Sadie L. Childs
Attorney, Agent, or Firm—Baker, Maxham, Callan & Jester

[57] ABSTRACT

A plastic substrate is injection molded to provide a pattern of channels in at least one of its sides to define a predetermined set of conductive paths. Both the surfaces of the channels and the non-channel surfaces therebetween are metalling through one or more steps of flame spraying, a combination of electroless plating and electroplating, gas plating or vacuum deposition. In one form of the invention the metallization over the non-channel surfaces is removed by abrading. In another form of the invention the initial metallization over the non-channel surfaces is coated with a resist prior to the deposition of another metal layer. The metal covering the channels is subsequently removed by stripping the resist and etching away the initial metallization.

15 Claims, 25 Drawing Figures

FABRICATION OF A PRINTED CIRCUIT BOARD WITH METAL-FILLED CHANNELS

CROSS-REFERENCE TO RELATED APPLICATIONS

This application is a continuation-in-part of my prior abandoned application Ser. No. 354,964 filed Mar. 5, 1982, which was a continuation-in-part of my prior abandoned application Ser. No. 306,240 filed Sept. 28, 1981, which was a continuation-in-part of my prior abandoned application Ser. No. 107,045 filed Dec. 26, 1979.

BACKGROUND OF THE INVENTION

Printed circuit boards have long been utilized for supporting and interconnecting electronic circuit components. Printed circuit boards are herein after referred to as "PC boards". Typically printed circuit boards are manufactured through a process in which a circuit pattern is delineated by using a photoresist on the face of a preformed insulating sheet having a metal surface bonded thereto. The portion of the metal surface which is not covered by the photoresist pattern is subsequently etched away to yield the desired conductive pattern on the insulating surface.

While integrated circuits have recently come into widespread use, printed circuit boards are still utilized extensively. It is usually necessary to physically support and interconnect a plurality of so-called IC chips with other discrete electronic components. Furthermore, many electronic circuits are not subject to miniaturization, for example power supplies and filtering circuits. These circuits consist of many discrete components which must be supported and interconnected on a printed circuit board.

The conventional method of producing printed circuit boards described above requires the steps of (1) covering the entire surface of the insulative board with a layer of conductive material, (2) applying a negative or reverse image of the conductive pattern using photoresist, and (3) etching away the excess conductive material with suitable etching agents. Clearly where thousands and even millions of units of a particular printed circuit board are to be produced, it is desirable from an economic standpoint to reduce the total number of steps in the manufacturing process. Furthermore, it is likewise desirable to reduce the quantity of materials required to produce the boards. The conventional method described above, when implemented on a large scale, results in the wastage of large amounts of conductive material, photoresist, and etching solution unless suitable means for recycling these materials are utilized.

SUMMARY OF THE INVENTION

The primary object of the present invention is to provide printed circuit boards which are capable of operating in both low and high temperature environments and which may be fabricated through processes involving a minimum number of steps and a minimum amount of materials.

In accordance with the present invention a plastic substrate is injection molded to provide a pattern of channels in at least one of its sides to define a predetermined set of conductive paths. Both the surfaces of the channels and the non-channel surfaces therebetween are metallized through one or more steps of flame spraying, a combination of electroless plating and electroplating, gas plating or vacuum deposition. In one form of the invention the metallization over the non-channel surfaces is removed by abrading. In another form of the invention the initial metallization over the non-channel surfaces is coated with a resist prior to the deposition of another metal layer. The metal covering the channels is subsequently removed by stripping the resist and etching away the initial metallization.

Other objects and advantages of the present invention will become more apparent upon a reading of the following detailed description taken in conjunction with the accompanying drawings, wherein like reference numerals designate like parts throughout. The dimensions in the drawings are not to scale.

BRIEF DESCRIPTION OF THE DRAWINGS

In FIG. 4a, the surface is metallized by flame spraying. In FIG. 4b, the surface is metallized by a combination of electroless plating and electroplating.

DESCRIPTION OF THE PREFERRED EMBODIMENTS

Figure 1:
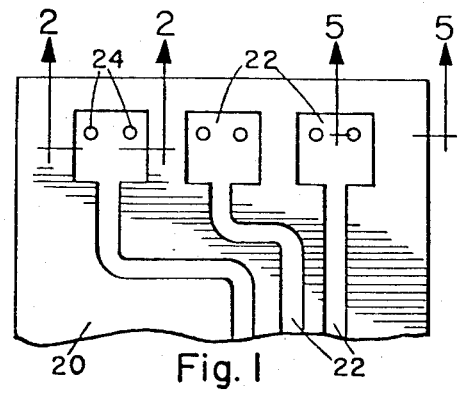
FIG. 1 is a fragmentary top plan view of a plastic substrate showing a simplified pattern of channels formed in the upper surface thereof.

According to a first embodiment of the present invention, a generally planar insulative substrate 20 is first formed as shown by way of example in FIG. 1. Preferably, the substrate is made of a thermoplastic or thermosetting plastic material so that a pattern of channels 22 can be readily formed on the upper surface of the substrate by conventional techniques such as injection or compression molding. Polycarbonates and polyesters are suitable plastic materials since they can be injection or compression molded. More conventional substrate materials such as Epoxy glass bonded laminate can also be utilized. The pattern of channels can be formed in this material by utilizing heat impression techniques similar in concept to the use of a branding iron.

Low temperature thermoplastic materials are suitable for printed circuit boards which are to operate in low temperature environments. The need for high temperature printed circuit boards is well known. The circuit board is often a permanent carrier for semiconductor and other electronic components that are capable of operating under high temperatures, for example, temperatures between 100 F. and 500 F. In a high temperature environment, many plastic substrates will melt or otherwise fail. Furthermore, where wave soldering is to be utilized, the substrate must be made of a plastic material having a high temperature resistance. Clearly plastic substrate materials not having sufficient high temperature resistance might deform, melt or otherwise fail when contacted by a molten solder bath. Suitable high temperature resistant plastic materials that can be utilized include polyimides, modified polyimides, polyether sulfone, polyphenylene sulfide resins and PET. type polyester. The latter three are high temperature resistant thermoplastic materials which can be injection molded to provide a substrate with the desired pattern of channels on one or both surfaces. One suitable polyphenylene sulfide resin is sold under the trademark RYTON by Phillips Corporation. A suitable polyimides is sold under the trademark KAPTON by DuPont. Other suitable substrate materials are polyetherimide sold under the trademark ULTEM by General Electric, modified polysulfone sold under the trademark MINDEL B 322 by Union Carbide, and FR-60 NYLON (Trademark) sold by DuPont.

Holes such as 24 (FIG. 1) and all other cutout configurations can be produced during the actual molding process or alternatively they can be subsequently machined into the molded substrate by drilling, routing and other suitable techniques. Typically these holes extend through the substrate and are located in the channels. It is desirable to form the holes during the molding process since this insures that there will be precise registration of the holes and the conductive pattern. When formed by subsequent machining, the holes can be misaligned due to machining tolerances and inaccuracies. If the holes are to be formed during the molding process, the mold sections (not shown) must be carefully formed with suitable projections that will define the holes in the substrate. The volume of units of a particular printed circuit board which are to be fabricated will determine whether it is more economical to bear the cost of fabricating more intricate molds versus subsequent drilling of the holes. In any case, the holes 24 receive the leads of the electronic components (not shown) which are to be mounted and interconnected on the finished printed circuit board.

Figure 2:
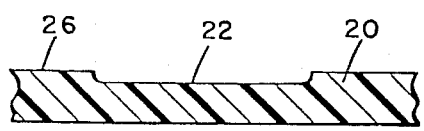
FIG. 2 is an enlarged fragmentary vertical sectional view of the plastic substrate of FIG. 1 taken along line 2—2 of FIG. 1.

FIG. 2 depicts a cross sectional view of a single one of the channels 22 formed into the upper surface 26 of the plastic substrate 20. The depth of the channel 22 is generally uniform throughout the entire surface of the substrate 20 since this facilitates the metallization of the substrate 20 to a level above the non-channel portions of the surface 26 as hereafter described. Preferably, the channels 22 have a depth of approximately 0.001 inches to approximately 0.010 inches. Generally, a reference herein to the surface 26 of the substrate means the entire upper side of the substrate which includes channel portions and non-channel portions.

Preferably, the upper surface 26 is roughened as shown at 26a in FIG. 3 to produce better adherence of the metal which is subsequently deposited thereon. This can be accomplished by sandblasting, plasma blasting, plasma etching, chemical etching, or by any other suitable method. The entire upper surface of the substrate is roughened including the depressed surfaces of the channels 22.

Figure 4A:
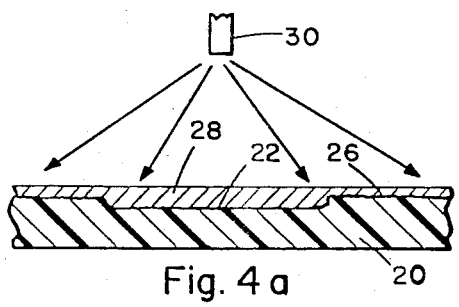
FIGS. 4a and 4b illustrate alternate ways of metallizing the roughened upper surface of the plastic substrate.

In a first embodiment of the invention, the entire upper surface 26 of the substrate is metallized by depositing thereon an electrically conductive metal. This can be accomplished by any suitable method such as by flame spraying, electroless plating, gas plating, or vacuum deposition. The metal is built up above the level of the non-channel surface of the substrate. FIG. 4a depicts the technique of flame spraying a high temperature resistant metal film 28 onto a high temperature resistant insulative substrate. Various techniques for forming a high temperature circuit board by flame spraying a high temperature resistant metal film onto a high temperature resistant substrate are disclosed in my U.S. Pat. No. 4,424,408.

The flame sprayed metal may comprise copper, aluminum, zinc, silver braze or suitable silver solder braze alloys such as percentage combinations as follows:

| Silver | 20 | 25 | 30 | 40 | 45 |
| Copper | 45 | 52.5 | 38 | 36 | 30 |
| Zinc | 35 | 22.5 | 32 | 24 | 25 |

Due to the extremely high cost of silver, it is preferably to flame spray a brass alloy of copper and zinc. Excellent results have been obtained using a brass alloy consisting of approximately 42% zinc and 58% copper, along with a minimal amount of impurities. One suitable brass alloy of this composition is sold under the trademark SPRABRONZE by Metco Inc. of Long Island, N.Y. A brass alloy of this composition has exhibited excellent bonding characteristics when flame sprayed onto polyimide or polyphenylene sulfide resin substrates. It is also resistant to high temperature.

The aforementioned suitable metals are flame sprayed from a source 30 (FIG. 4a) across the entire upper surface 26 of the substrate until the metal 28 is built up above the level of the non-channel surface of the substrate. The flame spraying process may be any known flame spraying process such as that accomplished by wire feeding. A powder feeding technique can be utilized to produce a finer or smoother coating. The layer of metal 28 securely attaches and affixes to the upper surface 26 of the insulated substrate. Preferably, the layer 28 has a minimum depth of the non-channel regions of the upper surface. This is so that only a minimum amount of grinding will be required to take the layer 28 down to the upper surface of the non-channel portions of the substrate. By way of example, if the channels 22 have a depth of approximately 0.005 inches, the layer 28 may be built up until it has a depth of approximately 0.008 to approximately 0.010 inches in the channel 22 and a depth of approximately 0.003 to approximately 0.005 inches elsewhere. Preferably, the metal layer extends no more than approximately 0.005 inches above the surface level. It should be pointed out that the substrate surface need not be metallized to an extent that the deposited metal is built up above the non-channel surface level in both the channel and non-channel regions. In some instances, it may be desirable to deposit a metal layer which is sufficiently thin so that its upper surface in the channel regions is below the non-channel surface level of the substrate. In this case, the conductive pattern of the finished board will be depressed below the non-channel surface level. This greatly reduces bridging problems encountered during wave soldering.

Figure 3:
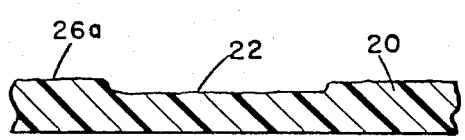
FIG. 3 is a view similar to FIG. 2 after the upper surface of the plastic substrate has been roughened to produce better adherence of the metal which is subsequently deposited thereon.
Figure 4B:
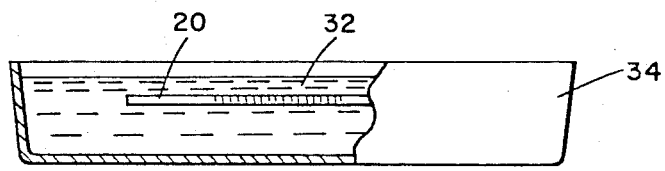

Alternatively, the roughened substrate 20 depicted in FIG. 3 can be metallized utilizing electroless plating or a combination of electroless plating and electroplating. As shown in FIG. 4b, the roughened substrate 20 may be consecutively immersed in three separate baths such as 32 contained within a tank 34. The first bath contains a sensitizer or activator such as an aqueous solution of a platinum or palladium salt. The second bath is an electroless plating bath which contains copper, nickel or some other suitable metal. Chemical reactions within this bath result in a thin metallic coating over the entire roughened upper surface 26 of the substrate. The final bath is a conventional electroplating bath which is utilized to build up the thickness of the initial metal layer with any electrically conductive metal capable of deposition by electroplating. During this electroplating process, the substrate 20, which now has a thin coating of metal adhered to its roughened upper surface 26, is placed in an electrolyte bath and the thin metal coating on the substrate is connected to one terminal of a DC voltage source. The metal to be deposited is similarly immersed in the electrolyte bath and it is connected to the other terminal of the DC voltage source. Ions of the metal to be deposited are transferred to the coated surface of the substrate as they make up the current between the electrodes. Metals which can be built up by electroplating include nickel, copper, silver, and gold, among others.

The electroplating may continue until the metal layer 28 (FIG. 5) is built up above the level of the non-channel portions of the surface 26. The thickness of the layer 28 produced by a combination of electroless plating and electroplating may be the same as that achieved with flame spraying as previously described. Or, as previously indicated, the electroplating may cease when the metal in the channels has been built up to a level below the non-channel surface level of the substrate. Not illustrated are various other techniques of depositing a metal layer over the entire upper surface 26 which include vacuum deposition, gas plating, sputtering, ion plating or electron beam plating.

Figure 5:
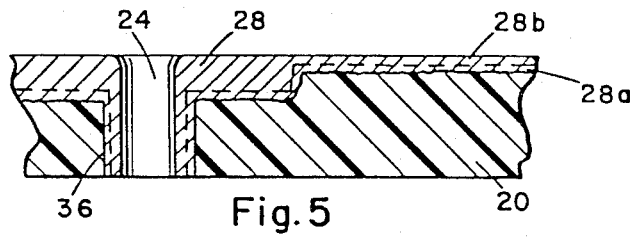
FIG. 5 is an enlarged fragmentary vertical cross sectional view taken along line 5—5 of FIG. 1 showing that the metallizing of the upper surface of the substrate by a combination of electroless plating and electroplating also metallizes the annular walls of the holes which extend therethrough.
Figure 6:
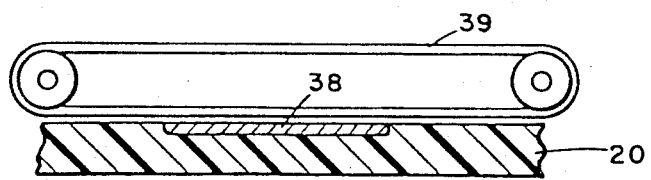
FIG. 6 is an enlarged fragmentary vertical sectional view illustrating the step of abrading the metallized substrate uniformly down to the plastic substrate utilizing an endless belt having an abrasive surface.
Figure 7:
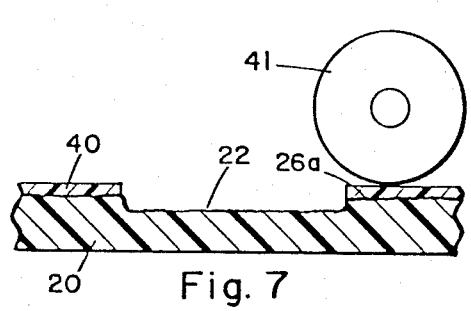
FIGS. 7–11 illustrate an alternate process of fabricating a printed circuit board having a conductive pattern of metal-filled channels. After the step depicted in FIG. 3, resist, flame spraying, and etching steps are utilized prior to the abrading step.

FIG. 5 depicts a vertical cross section of the substrate 20 after the roughened upper surface 26 has been metallized by electroless plating and thereafter electroplating. The metal layer 28 comprises upper and lower layers 28a and 28b shown diagrammatically in FIG. 5 as being separated by a phantom line. The holes such as 24 are plated through as shown in FIG. 5. In other words, the annular walls such as 36 of the holes are coated with the same metal or metals as the upper surface 26. The walls of the holes may not get plated when the substrate is metallized by flame spraying. In a PC board having conductive patterns on both sides, metallized hole surfaces are desired, as further explained hereafter in conjunction with FIG. 12.

The final step is to sand, grind, machine or otherwise abrade the metal layer 28 down to the level of the non-channel portion of the surface 26. This will leave an electrically conductive pattern on the upper side of the board which consists of a plurality of metal-filled channels 38. When the metal in the non-channel regions has only been built up to a level below the non-channel surface, only the metal over the non-channel surface is abraded. One suitable technique of accomplishing the abrading step is to pass the metallized substrate beneath a moving endless belt such as 39 having an abrasive material adhered to its outer surface. One suitable abrasive material is emery, however, a wide variety of abrasive materials and techniques can be utilized depending upon the characteristics of the metallization.

Warpage of the substrate 20 may result from the molding, plating or handling steps of the fabrication process. In addition, the upper and lower surfaces of the molded substrate are sometimes non-parallel, i.e. the thickness varies over the length or width of the substrate. This may occur, for example, as the result of tolerances in the molding process. If the substrate is warped or if the upper and lower surfaces of the substrate are not uniformly parallel, various conventional abrading techniques can result in insufficient metallization being removed in some portions of the PC board and too much metallization being removed in other areas. I have found this to be the case with the surface, blanchard and double disc grinding, with dry and wet belt sanding, with single side disc grinding, thru feed grinding, vibration grinding and sanding, deburring equipment abrading and with EDM techniques. I have discovered that the warpage and non-parallel surface problems leading to non-uniform abrading can be overcome utilizing free abrasive machining.

Figure 23:
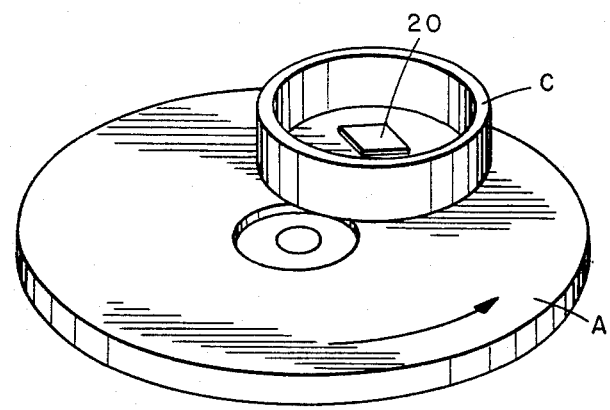
FIG. 23 is a simplified perspective view illustrating a method of performing free abrasive machining to grind the metallized substrate uniformly down to the plastic substrate.
Figure 24:
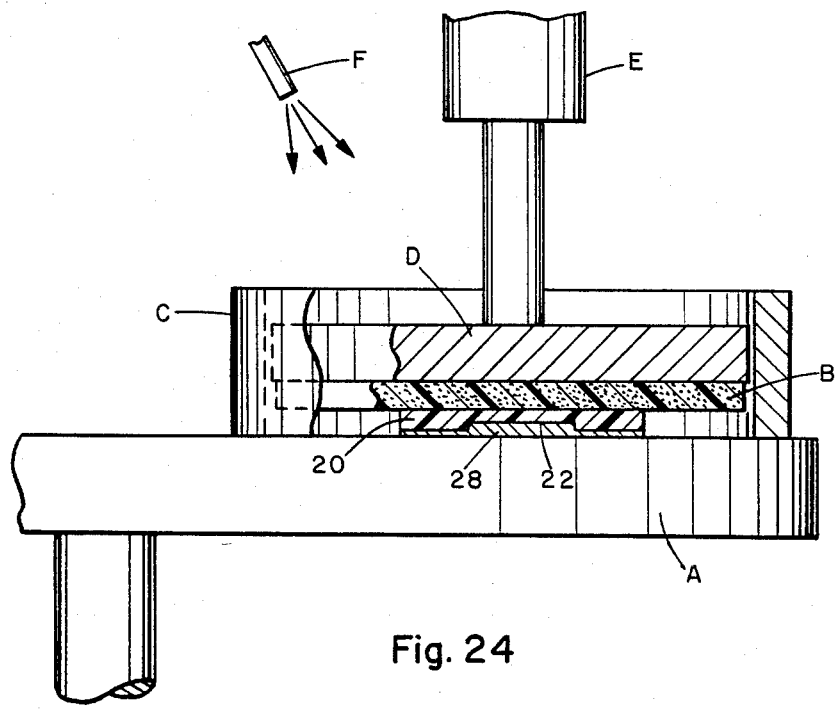
FIG. 24 is an enlarged, fragmentary side elevation view further illustrating the free abrasive machining method.

Suitable apparatus for carrying out free abrasive machining on the metallized substrates are sold under the trademarks SPEEDFAM and FAM by SPEEDFAM Corporation, 509 Third Avenue, Des Plaines, Ill., 60616. FIGS. 23 and 24 are simplified views illustrating the free abrasive machining of a metallized substrate 20 with an apparatus of the type available from SPEEDFAM Corporation. The substrate 20 is placed with its metal layer 28 face down against the surface of a large rotatably driven disc A. A foam rubber pad B (FIG. 24) is placed over the substrate and a ring C is placed on the disc A enclosing the pad B and substrate 20. A piston D fits within the ring C and compresses the pad B and substrate 20 downwardly via the force of air cylinder assembly E. As the disc A is slowly rotated, the air cylinder E remains stationary. The piston D rotates together with the ring C around the fixed vertical axis of the air cylinder E. An abrasive slurry is dripped onto the top surface of the disc A from a nozzle E of a manifold as indicated by the arrows in FIG. 24. As the disc A slowly rotates, the abrasive slurry grinds down the metal layer 28 on the PC board as the upper surface of the disc A slides snuggly against the metal layer. The PC board is held firmly down against the upper surface of the large disc A by the air cylinder E. This holds the PC board flat against the large disc, thereby eliminating the undesirable effects of any warpage in the PC board. The pad B accommodates for any variations in the thickness of the PC board. Through this technique, very small depths of the metal layer 28 can be uniformly and smoothly abraded off of the PC board. For example, in a matter of minutes two to four thousandths of an inch of metal can be uniformly abraded off of the PC board. Any conventional abrasive slurry may be utilized, such as silicon carbide, aluminum oxide, tungsten carbide or diamond dust suspended in oil or water. If the PC board has been metallized on both sides, one side is ground down by the free abrasive machining process, and then the PC board is flipped over so that the other side can be ground down. I have found that this process produces results far superior to any of the other abrading processes outlined above.

The completed printed circuit board of the first embodiment just described is adapted for having electronic components assembled thereon and soldered thereto in any conventional manner. Where wave soldering is utilized, there is a reduced likelihood that solder will bridge adjacent conductive paths since they are flush with the surface of the substrate and do not extend above the same. The fabrication process is greatly simplified, there being no resist masking and etching steps. Significant material savings result since photoresist and etching solutions need not be utilized. Furthermore, the particles of matter of which are ground away to produce the conductive patterns can readily be recycled for utilization in the selected metallizing process.

FIGS. 7–11 relate to a second embodiment of the present invention. It takes advantage of the fact that a plastic substrate having a pattern of channels formed on one or both sides can very readily have a reverse conductive pattern image made of resist 40 (FIG. 7) applied thereto. A wide variety of commercially available resists can be used, for example those sold under the trademarks NAZDAR and WARNOW. Normally, such reverse image resist patterns are applied by standard silk screening techniques or by conventional photolithographic techniques. The silk screening and the photolithographic techniques for forming a reverse image each require several steps. However, it is possible with the plastic substrate of the present invention to form the reverse resist image 40 by coating the non-channel surface of the substrate. This can be done, for example, by passing a roller 41 coated with resist over the non-channel surface of the substrate. So long as the outer surface of the roller is hard enough so that it does not deform too far into the channel 22, the resist will only coat the non-channel portions of the upper surface 26.

Figure 8:
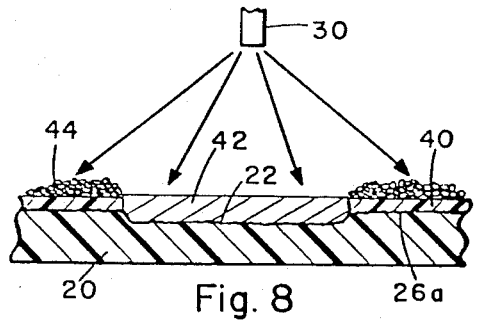
Figure 9:
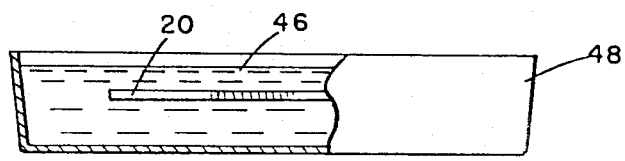

After the reverse image of resist 40 has been rolled onto the upper surface of the substrate, any of the aforementioned suitable metals can then be flame sprayed across the entire upper surface of the board as illustrated in FIG. 8. The layer of sprayed metal securely attaches and affixes as indicated by reference numeral 42 to the roughened depressed surfaces of the channel 22. However, the metal at 44 which is deposited onto the reverse resist image 40 will not adhere to the photoresist.

Figure 10:
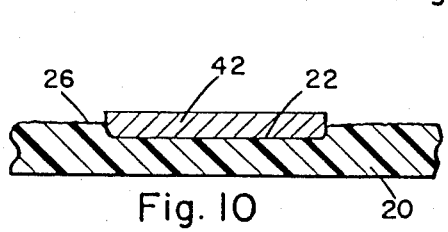
Figure 11:
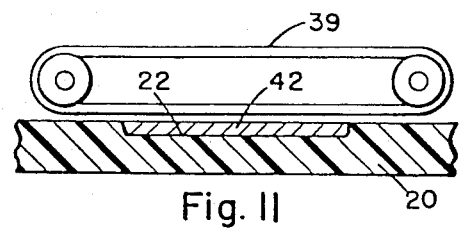

After metallizing the substrate, the resist is removed. This can be done by dipping the metallized substrate in a bath 46 (FIG. 9) of a suitable stripper solution contained within a tank 48. This removes the reverse resist image 40 and the unadhered flame sprayed metal 44, leaving only the metal 42 deposited in the channels 22 as shown in FIG. 10. A combination of electroless and electroplating can be substituted for the flame spraying in the foregoing process. Thus, a printed circuit board is produced having a conductive pattern of metal filled channels which extend above the non-channel surface 26 of the substrate. The printed circuit board thus produced may be used without further processing. However, if electronic components are to be attached by wave soldering, it is desirable, for the reasons already mentioned, to abrade the metal layer 42 down to the level of the non-channel surface 26 of the substrate as shown in FIG. 11. The abrading step may be unnecessary where the metal is flame sprayed to a level in the channels which is at or below the non-channel substrate surface. Again, this second embodiment can be modified so that the finished board has a depressed conductive pattern, i.e., one that extends horizontally in the plane of the substrate below non-channel surface level.

Figure 12:
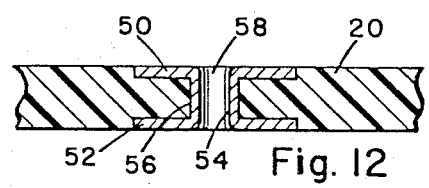
FIG. 12 is an enlarged fragmentary vertical sectional view of a completed two-sided printed circuit board having opposing metal-filled channels on its upper and lower surface connected by a hole having a metallized annular wall.

In FIG. 12, both of the upper and lower surfaces of the substrate have a conductive pattern of metal-filled channels. This printed circuit board can be fabricated according to either of the previously described embodiments, the steps of each being performed on both the upper and lower surfaces of the substrate. Where the initial metal layer is flame sprayed, a subsequent layer must be deposited by electroless plating to insure that the surfaces of the holes are coated. In the illustrated example, opposing metal-filled channels 50 and 52 on the upper and lower surfaces of the substrate 20, respectively, are electrically connected by a metal layer 54 adhered to the annular wall 56 of the hole 58 through the substrate. These plated through holes permit electronic components mounted on one side of the printed circuit board to be electrically interconnected by conductive paths which extend on the other side of the board.

Figure 13:
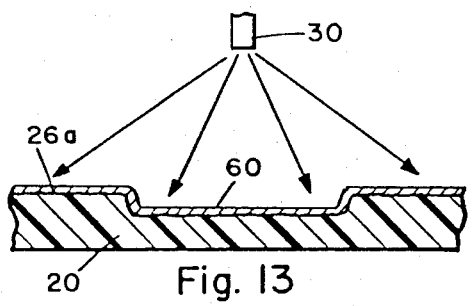
FIGS. 13–15 illustrate another alternate process for forming a printed circuit board having a conductive pattern of metal-filled channels. After the step illustrated in FIG. 3, two different metal layers are flame sprayed onto the upper surface of the substrate. The first layer securely adheres to the substrate and provides an excellent bondable surface for the subsequent layer which otherwise bonds poorly to the substrate.
Figure 14:
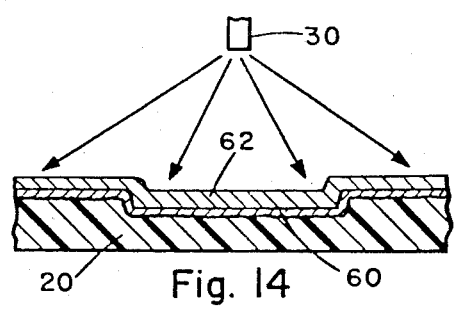

Experiments have shown that some metals do not adhere adequately to some plastic substrates when directly flame sprayed thereon. These include nickel, tin, bronze, monel and chrome. A third embodiment of the invention overcomes this problem by having separate flame spraying steps by which different metals are deposited. After the substrate has been prepared as previously described and illustrated in FIG. 3, the roughened upper surface 26a is then metallized by flame spraying a thin first layer 60 of aluminum, brass or copper onto the upper surface as shown in FIG. 13. This aluminum, brass or copper layer 60 may have a thickness of approximately 0.001 inches to approximately 0.005 inches. A second metallized layer 62 is then flame sprayed over the first layer 60 as shown in FIG. 14. This second layer may comprise a silver solder braze alloy according to the following percentage combinations:

| Silver | 20 | 25 | 30 | 40 | 45 |
|--------|----|-----|----|----|----|
| Copper | 45 | 52.5 | 38 | 36 | 30 |
| Zinc | 35 | 22.5 | 32 | 24 | 25 |

The second layer 62 may also comprise one of the alloys as set forth hereinafter:

| Silver | 5 | 15 | 5 | 7 | 9 | — | — | — | — |
|--------|---|----|---|---|---|---|---|---|---|
| Copper | 89 | 80 | 58 | 85 | 53 | 60 | 100 | 50 | — |
| Zinc | — | — | 37 | — | 38 | 40 | — | 40 | — |
| Phospho- | 6 | 5 | — | — | — | — | — | — | — |

| | | | | | | | | | |
|---|---|---|---|---|---|---|---|---|---|
| rous Tin | — | — | — | 8 | — | — | — | — | — |
| Nickel | — | — | — | — | — | — | — | 10 | 100 |

Figure 15:
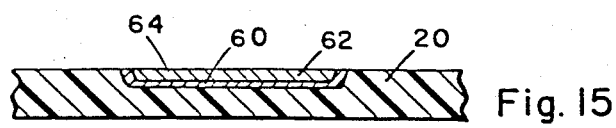

The second layer 62 may comprise a brass alloy consisting of approximately 42% zinc and 58% copper. In addition, the second layer 62 may also include nickel electroplated, nickel electroless plated, copper electroplated, and copper electroless plated. The second layer may have a thickness of approximately 0.001 inches to approximately 0.006 inches. Finally, the entire upper surface of the metal plated substrate is abraded down to the non-channel surface of the plastic substrate (FIG. 15) as previously described so that the completed printed circuit board has a conductive pattern of metal filled channels 64.

Figure 16:
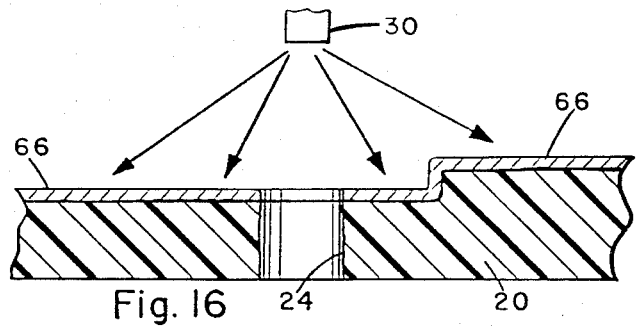
FIGS. 16–22 illustrate the steps involved in the fabrication of yet another form of the invention.
Figure 17:
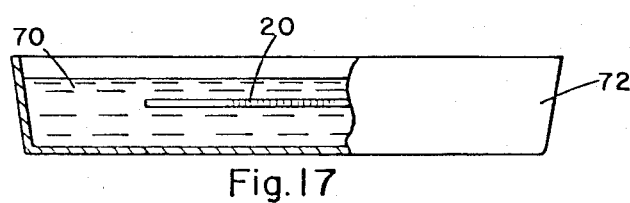
Figure 18:
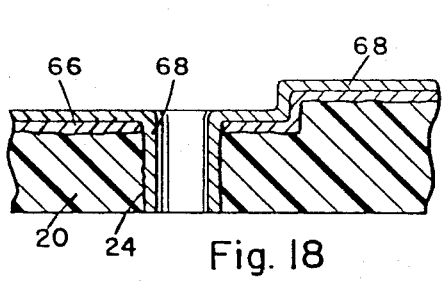

A fourth embodiment of the present invention will now be described by way of reference to FIGS. 16–22. A thin coating 66 of a bond enhancing metal such as copper or brass alloy is flame sprayed onto the entire roughened upper surface of the substrate 20 as illustrated in FIG. 16. This layer is preferably 0.005 inches or less in thickness so that the annular walls of the holes 24 are not coated. Next, as illustrated in FIGS. 17 and 18, another thin layer 68 of metal such as copper or nickel is electroless plated onto the substrate in a bath 70 contained within a tank 72. This metallizes the annular walls of the holes.

Figure 19:
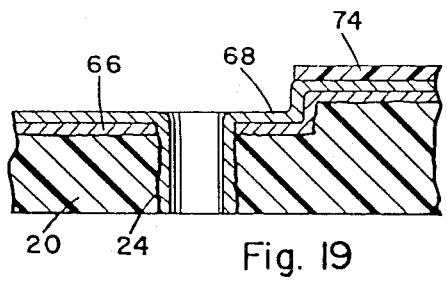
Figure 20:
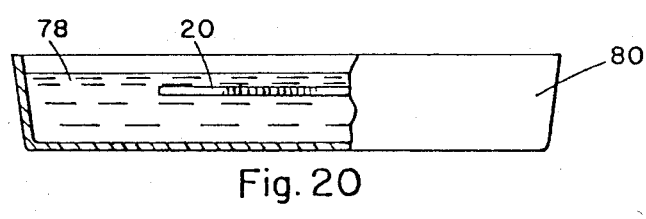
Figure 21:
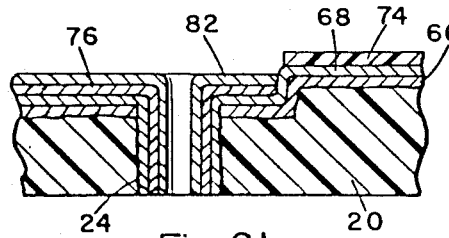
Figure 22:
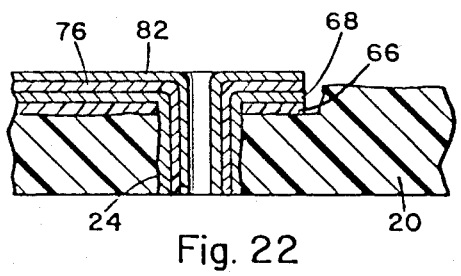

A coating 74 of a resist is applied to the non-channel surface of the layer 68 as illustrated in FIG. 19. Thereafter, as illustrated in FIGS. 20 and 21, another layer 76 of copper or nickel is electroplated via bath 78 in tank 80 onto the portions of the metal layer 68 which are in the channels and holes. Another layer 82 of solder (tin/lead alloy) may also be electroplated onto the substrate.

The resist 74 (FIG. 22) is chemically stripped and then the metal above the non-channel regions of the substrate is chemically etched away. The portions of the substrate defining the holes and channels are not etched since they are covered with tin/lead alloy, which resists the etch. The conductive pattern thus remains. Even if the tin/lead coating has not been applied, the etching time is controlled so that the holes and channels remain metallized while the non-channel regions are etched down to the substrate.

The fourth embodiment may be modified by skipping the initial flame spraying step and using only electroless plating initially, applying the resist, and electroplating thereafter. Furthermore, instead of chemical stripping and etching, abrading may be utilized.

Preferably, the printed circuit boards of any of the foregoing embodiment is subjected to a baking step at the end of the fabrication process. This enables PC board to withstand the high temperatures encountered in wave soldering without any release or failure of the bond between the deposited metal and the substrate. Good results have been achieved in baking the PC boards in an oven at a temperature of 400 degrees F. to 550 degrees F. for a time of about 30 seconds to about 15 minutes. With a substrate made of RYTON brand material, PET. type polyester material or other suitable high temperature plastics coated with brass, thin brass plus electroless copper, or electroless copper plus electroplated copper, oven baking at 510 degrees F. for 1 to 10 minutes has produced excellent results.

The oven baking results in a gradual rise in the temperature of the PC board, which cures and improves the substrate to metal bond. Without oven baking, exposure of the PC board to a molten solder bath almost instantaneously brings the PC board to a very high temperature, which in some cases results in a failure of the substrate/metal bond.

Having described preferred embodiments of the present invention, it will be apparent that the invention permits modification in both arrangement and detail. For example, any of the embodiments disclosed above may be modified by forming a substrate without channels and using conventional resist and mask techniques to delineate the conductive pattern. With a channeled substrate, a first metal layer may be built up by electroless plating, followed by abrading, and then more electroless plating to achieve the desired thickness. If all the conductive paths on the PC board are tied together or common, the PC board channeled substrate may be electroless plated, then abraded or masked and then electroplated to full thickness. If masking is used then the mask may be chemically stripped and metal etched, or the resist and unwanted metal may be abraded. In both foregoing processes, the initial bond enhancing layer may be flame sprayed instead of electroless plated. Where plating through holes are necessary, electroless plating would be added prior to the abrading or masking. Where plated through holes are not required the initial electroless plating may be skipped. Therefore, the present invention should be limited only in accordance with the scope of the following claims.

I claim:

1. A process of fabricating a circuit board comprising the steps of:

injection molding a plastic substrate having a pattern of channels in at least one of its sides defining channel surfaces and non-channel surfaces, the pattern of channels representing a predetermined set of conductive paths extending along the one side of the substrate;

depositing at least one layer of metal onto the one side of the substrate over the channel surfaces and the non-channel surfaces thereof, the depositing being performed according to a method selected from the group consisting of flame spraying, a combination of electroless plating and electroplating, gas plating and vacuum deposition; and removing the metal above the non-channel surfaces of the one side of the substrate to delineate a conductive pattern of metal-filled channels.

2. A process according to claim 1 and further comprising the step of roughening the one side of the substrate prior to depositing the layer of metal thereon, the roughening being performed according to a method selected from the group consisting of sandblasting, plasma blasting, plasma etching and chemical etching.

3. A process according to claim 1 and further comprising the step of coating the non-channel surfaces of the one side of the substrate with a layer of resist prior to depositing the layer of metal on the one side of the substrate; and wherein the removing step is performed by chemically stripping the layer of resist and the metal deposited thereon.

4. A process according to claim 1 wherein the removing step is performed by abrading the layer of metal down to the level of the non-channel surfaces of the one side of the substrate.

5. A process according to claim 1 wherein the metal is deposited by flame spraying and the metal is a brass alloy consisting of approximately 42% zinc and 58% copper.

6. A process according to claim 1 wherein the metal layer is deposited onto the one side of the substrate by a combination of electroless and electroplating and the metal is selected from the group consisting of nickel and copper.

7. A process according to claim 1 wherein the metal layer is deposited by flame spraying and the metal is selected from the group consisting of copper, brass alloy, aluminum, zinc and silver solder braze alloy.

8. A process according to claim 1 wherein the substrate is made of a heat resistant plastic selected from the group consisting of polyimides, modified polyimides, polyether sulfone, polyphenylene sulfide resins, PET type polyester, polyetherimide, modified polysulfone and Nylon.

9. A process according to claim 1 and further comprising the step of baking the substrate after the layer of metal has been deposited thereon at a temperature of between about 400 degrees F. and 550 degrees F. for a time of between about 30 seconds and 15 minutes.

10. A process according to claim 1 wherein the depositing step includes the steps of flame spraying a bond enhancing first layer of metal onto the channel and non-channel surfaces of the substrate, and depositing a second layer of metal onto the first layer of metal by a method selected from the group consisting of flame spraying, electroless plating and electroplating.

11. A process according to claim 1 wherein the removing step is performed by abrading the layer of metal down to the level of the non-channel surfaces of the one side of the substrate with an abrasive slurry.

12. A process according to claim 11 wherein the removing step is performed by pressing the layer of metal against a moving surface by applying pressure to the other side of the substrate and dispensing the abrasive slurry so that it is carried between the moving surface and the metal layer.

13. A process according to claim 12 wherein the pressure is applied to the other side of the substrate through a resilient pad to accommodate any variations in the thickness of the substrate.

14. A process of fabricating a circuit board comprising the steps of:
injection molding a substantially planar substrate of a material selected from the group consisting of polyimides, modified polyimides, polyether sulfone, polyphenylene sulfide resins, PET type polyester, polyetherimide, modified polysulfone and Nylon;
applying a layer of a resist to define a reverse image of a conductive pattern;
flame spraying a bond enhancing metal layer onto the substrate, the first metal selected from the group consisting of copper, brass alloy, aluminum, zinc and silver solder braze alloy;
depositing a second metal layer onto the bond enhancing metal layer; and
etching away portions of the metal layers above the resist to delineate the conductive pattern.

15. A process of fabricating a circuit board comprising the steps of:
injection molding a substrate having a pattern of channels in at least one of its sides defining channel surfaces and non-channel surfaces, the pattern of channels representing a predetermined set of conductive paths extending along the one side of the substrate, the substrate being molded of a material selected from the group consisting of polyimide, modified polyimide, polyetherimide, polyether sulfone, polyphenylene sulfide resin, PET type polyester, modified polysulfone and Nylon;
electroless plating a layer of a first metal onto the channel surfaces and non-channel surfaces of the substrate;
applying a layer of resist over the portions of the layer of the first metal which overlie the non-channel surfaces of the substrate;
electroplating a layer of a second metal over the portions of the layer of the first metal which overlie the channel portions of the substrate; and
chemically removing the resist and the portions of the layer of the first metal which overlie the non-channel surfaces of the substrate.

* * * * *

UNITED STATES PATENT AND TRADEMARK OFFICE
CERTIFICATE OF CORRECTION

PATENT NO. : 4,532,152

DATED : July 30, 1985

INVENTOR(S) : Vito D. Elarde

It is certified that error appears in the above-identified patent and that said Letters Patent is hereby corrected as shown below:

ABSTRACT, line 5, delete "metalling" and insert therefor --metallized--.

ABSTRACT, line 13, delete "channels" and insert therefor --non-channel surfaces--.

Column 2, line 6, delete "channels" and insert therefor --non-channel surfaces--.

Column 3, line 44, delete "polyimides" and insert therefor --polyimide--.

Column 5, line 1, delete "of" and insert therefor --in--.

Column 6, line 38, delete the second occurrence of "the".

Column 6, line 64, delete "E" and insert therefor --F--.

Column 7, line 31, delete the second occurrence of "of".

Signed and Sealed this

Thirty-first Day of December 1985

[SEAL]

Attest:

DONALD J. QUIGG

Attesting Officer

Commissioner of Patents and Trademarks